US009614110B2

(12) United States Patent
Kim et al.

(10) Patent No.: US 9,614,110 B2
(45) Date of Patent: Apr. 4, 2017

(54) PHOTO DETECTOR

(71) Applicant: ELECTRONICS AND TELECOMMUNICATIONS RESEARCH INSTITUTE, Daejeon (KR)

(72) Inventors: Jin Tae Kim, Daejeon (KR); Choon Gi Choi, Daejeon (KR); Young Jun Yu, Daejeon (KR); Kwang Hyo Chung, Daejeon (KR); Jin Sik Choi, Daejeon (KR); Hong Kyw Choi, Busan (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 15/072,228

(22) Filed: Mar. 16, 2016

(65) Prior Publication Data
US 2016/0308077 A1 Oct. 20, 2016

(30) Foreign Application Priority Data

Apr. 20, 2015 (KR) .................. 10-2015-0055369

(51) Int. Cl.
| H01L 31/02 | (2006.01) |
| H01L 31/028 | (2006.01) |
| H01L 31/0352 | (2006.01) |
| H01L 31/09 | (2006.01) |
| H01L 31/101 | (2006.01) |

(52) U.S. Cl.
CPC ...... H01L 31/028 (2013.01); H01L 31/03529 (2013.01); H01L 31/09 (2013.01); H01L 31/101 (2013.01)

(58) Field of Classification Search
CPC . H01L 29/06; H01L 29/0665; H01L 29/0673; H01L 31/02; H01L 31/028; H01L 31/03; H01L 31/035; H01L 31/0352; H01L 31/03529; H01L 31/09; H01L 31/10; H01L 31/101
USPC .......................................................... 257/9
See application file for complete search history.

(56) References Cited

U.S. PATENT DOCUMENTS

| 8,053,782 | B2 | 11/2011 | Avouris et al. |
| 8,624,223 | B2* | 1/2014 | Chen ................ H01L 29/78 257/20 |
| 8,810,996 | B2* | 8/2014 | Lee ................ H01G 11/36 361/502 |
| 2013/0126700 | A1 | 5/2013 | Choi et al. |
| 2013/0285018 | A1 | 10/2013 | Yoo et al. |
| 2013/0313523 | A1 | 11/2013 | Yun et al. |
| 2014/0105553 | A1 | 4/2014 | Kim et al. |

* cited by examiner

Primary Examiner — Monica D Harrison
(74) Attorney, Agent, or Firm — Rabin & Berdo, P.C.

(57) ABSTRACT

Disclosed is a photo detector. The photo detector includes: a conductive substrate; an insulating layer formed on the conductive substrate; a single-layer graphene formed at one part of an upper end of the insulating layer and formed in one layer; a multi-layer graphene formed at the other part of the upper end of the insulating layer and formed in multiple layers; a first electrode formed at an end of the single-layer graphene; and a second electrode formed at an end of the multi-layer graphene.

6 Claims, 3 Drawing Sheets

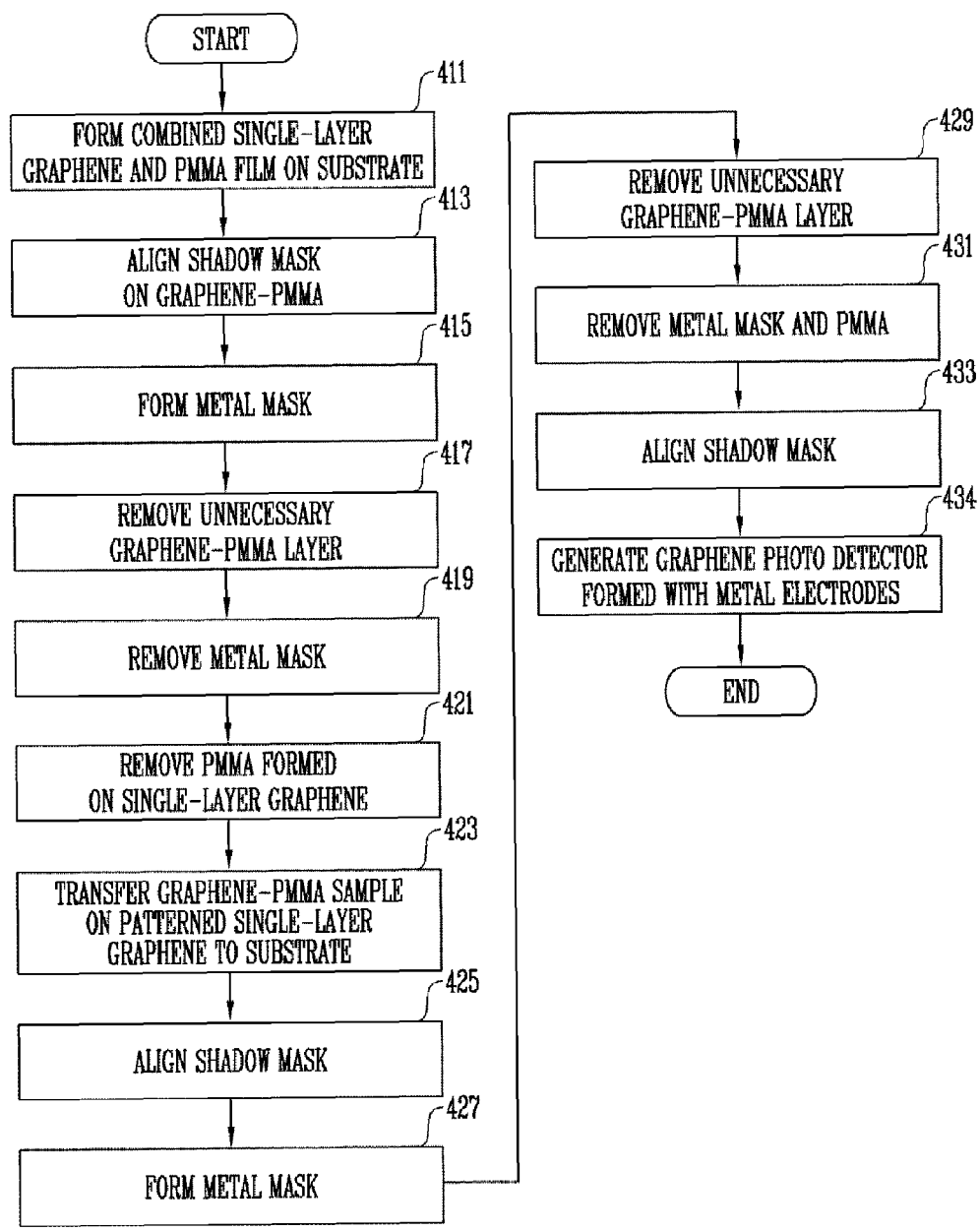

PHOTO DETECTOR

CROSS-REFERENCE TO RELATED APPLICATION

This application claims priority to and the benefit of Korean Patent Application No. 10-2015-0055369, filed on Apr. 20, 2015, in the Korean Intellectual Property Office, the entire contents of which are incorporated herein by reference in their entirety.

BACKGROUND

1. Field

The present disclosure relates to a photo detector, and more particularly, to a photo detector, which detects incident light by using a periodic arrangement of a single-layer graphene and a multi-layer graphene.

2. Description of the Related Art

There are photo detectors having a structure, in which heterogeneous metals are positioned at both ends of the photo detector. The photo detector has heterogeneous metal electrodes, so that a process, such as multi-stage photo lithography or lift-off, is additionally required.

There is a graphene photo detector using a flow of carriers generated when nanoparticles are inserted between the graphenes and light is radiated between graphene nanoparticles. The photo detector requires an additional process, in which a graphene phase needs to form the nanoparticles. Further, the photo detector is utilized as a limited photo detector for detecting only light of a specific wavelength responding to an interaction between the graphene nanoparticles.

Further, there is a photo detector, in which when electrodes are formed at both ends of a graphene and light is radiated to a boundary surface of the graphene and the electrodes in a vertical direction, a photo current flows between both electrodes. In this case, in the photo detector, a pair of electron and hole is generated in the graphene, which receives light, so that a current is generated. In the photo detector, light needs to be always radiated to the boundary surface of the graphene and the metal, and when light is radiated to both boundary surfaces of the graphene and the metal at the same time, currents having the same size flowing in opposite directions are generated at both sides, so that a sum of photo currents becomes zero.

In this respect, a photo detector, which is capable of avoiding forming heterogeneous electrodes and detecting an optical signal even in a situation where light is radiated to a boundary surface of a graphene and a metal, has been required.

SUMMARY OF THE INVENTION

The present disclosure has been made in an effort to solve the above-described problems associated with the prior art, and provides a photo detector, which is capable of avoiding forming heterogeneous electrodes and detecting an optical signal even in a situation where light is radiated to a boundary surface of a graphene and a metal, has been required.

An exemplary embodiment of the present disclosure provides a photo detector, including: a conductive substrate; an insulating layer formed on the conductive substrate; a single-layer graphene formed at one part of an upper end of the insulating layer and formed in one layer; a multi-layer graphene formed at the other part of the upper end of the insulating layer and formed in multiple layers; a first electrode formed at an end of the single-layer graphene; and a second electrode formed at an end of the multi-layer graphene.

The single-layer graphene and the multi-layer graphene may have an interdigitated structure.

Each of the single-layer graphene and the multi-layer graphene may be implemented in a form of quadrangular saw teeth.

The single-layer graphene and the multi-layer graphene may have a structure, in which the saw teeth portions formed based on a direction connecting the first electrode and the second electrode are sequentially and alternately and disposed.

The quantity of photo current may be increased by applying a voltage between the substrate and the electrodes.

A boundary surface of the single-layer graphene and the multi-layer graphene may be formed between the first electrode and the second electrode.

In the photo detector of the present disclosure, the single-layer graphene and the multi-layer graphene are formed at the upper end of the insulating layer, so that it is possible to avoid forming of heterogeneous metal electrodes and minimize damage to the graphene during a manufacturing process of the photo detector. Further, the photo detector according to the present disclosure uses electrodes formed of a single metal by using a photo-thermoelectric effect generated on the boundary surface of the single-layer graphene and the multi-layer graphene, thereby simplifying a structure of an element and not being dependent on a wavelength of incident light.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 4 is a diagram illustrating a method of manufacturing the photo detector according to an exemplary embodiment of the present disclosure.

DETAILED DESCRIPTION OF THE INVENTION

Hereinafter, exemplary embodiments according to the present disclosure will be described in detail with reference to the accompanying drawings. In the description below, it should be noted that only parts necessary for understanding operations according to various exemplary embodiments of the present disclosure will be described, and descriptions of other parts may be omitted so as to avoid unnecessarily obscuring the subject matter of the present disclosure.

The present disclosure provides a photo detector, which is capable of avoiding forming heterogeneous electrodes and detecting an optical signal even in a situation where light is radiated to a boundary surface of a graphene and a metal, has been required.

Figure 1:
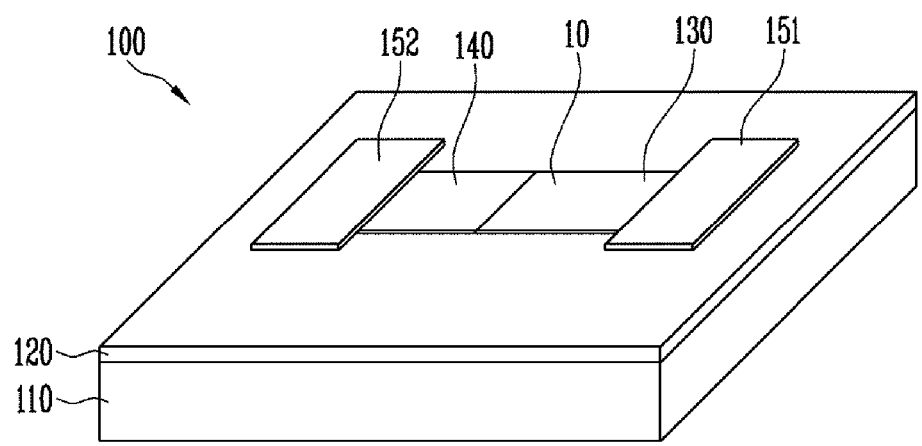
FIG. 1 is a diagram illustrating a photo detector according to an exemplary embodiment of the present disclosure.

FIG. 1 is a diagram illustrating a photo detector according to an exemplary embodiment of the present disclosure.

Referring to FIG. 1, a photo detector 100 includes a conductive substrate 110, an insulating layer 120, graphenes 130 and 140, and electrodes 151 and 152. Here, the photo detector 100 includes a graphene photo detector.

The conductive substrate 110 is a substrate for forming the photo detector 100, for example, a graphene photo detector.

The insulating layer 120 is formed on the conductive substrate 110.

The graphenes 130 and 140 are formed on the insulating layer. In this case, the graphenes 130 and 140 include a single-layer graphene 130 and a multi-layer graphene 140, and a boundary surface 10 of the graphenes 130 and 140 are formed according to the combination of the two types of graphenes 130 and 140.

The graphene is a material in which carbon atoms are connected with each other to form a thin plane structure shaped like a beehive, and has an electrical characteristic. In this case, the carbon atoms may be connected with each other to form one carbon atom layer, and the graphene may be formed of a single-layer or multi-layer carbon atom layer. In this case, a thickness of the single-layer graphene 130 may be the same as that of one carbon atom. The carbon atom has a basic unit of a 6-membered ring, and may also be formed of a 5-membered ring or a 7-membered ring.

That is, the single-layer graphene 130 represents a graphene formed of one layer, and the multi-layer graphene 140 represents a graphene formed of two or more layers, that is, a plurality of layers.

The first electrode 151 is positioned at one end of the graphenes 130 and 140, and the second electrode 152 is formed at the other end of the graphenes 130 and 140.

An operation of the photo detector 100 will be described below.

When light is radiated to the boundary surface 10 of the single-layer graphene 130 and the multi-layer graphene 140, a photo current flows by a photo-thermoelectric effect. When light is radiated to the boundary surface 10 of the single-layer graphene 130 and the multi-layer graphene 140, a temperature of the boundary surface 10 becomes higher than a temperature of the boundary surface of the metal electrode, to which light is not radiated, and a photo current flows between the electrodes 151 and 152 positioned at both ends of the graphenes 130 and 140 by the photo-thermoelectric effect. In this case, when a voltage is applied between the electrodes 151 and 152 and the conductive substrate, the quantity of photo current may be increased. This is similar to an increase in a current according to an application of a gating voltage.

Figure 2:
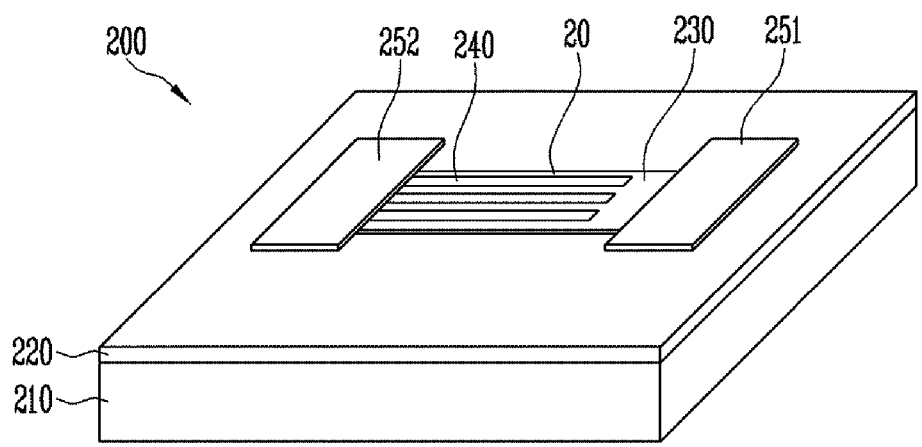
FIG. 2 is a diagram illustrating a photo detector according to another exemplary embodiment of the present disclosure.

FIG. 2 is a diagram illustrating a photo detector according to another exemplary embodiment of the present disclosure.

Referring to FIG. 2, a photo detector 200 includes a conductive substrate 210, an insulating layer 120, graphenes 230 and 240, and electrodes 251 and 252. Here, f the photo detector 200 is different from the photo detector of FIG. 1 in the structures of the graphenes 230 and 240.

The single-layer graphene 230 and the multi-layer graphene 240 has a structure, in which the single-layer graphene 230 and the multi-layer graphene 240 are engaged with each other (that is, an interdigitated electrode structure), and a recess for inserting the multi-layer graphene 240 is formed in the single-layer graphene 230, and a recess for inserting the single-layer graphene 230 is formed in the multi-layer graphene 240. That is, the single-layer graphene 230 and the multi-layer graphene 240 have a form of quadrangular saw teeth, and are engaged with each other. The quadrangular saw teeth as the forms of the single-layer graphene 230 and the multi-layer graphene 240 are illustrative, and the single-layer graphene 230 and the multi-layer graphene 240 may be implemented in various patterns, such as a trapezoid shape and a polygonal shape.

Accordingly, the single-layer graphene 230 and the multi-layer graphene 240 has structures, in which the saw teeth portions formed based on a line connecting the first electrode 251 and the second electrode 252 are sequentially and alternately disposed. In this case, a form, a length, and a thickness of the saw teeth portion may be variously adjusted for performance of the photo detector.

The aforementioned structures of the graphenes 230 and 240 may improve photoelectric conversion efficiency. This may increase a physical length of the boundary surface 20 of the single-layer graphene 230 and the multi-layer graphene 240 to improve photoelectric conversion efficiency. Accordingly, it is possible to obtain a larger photo current with respect to the radiation of the same quantity of light.

Figure 3A:
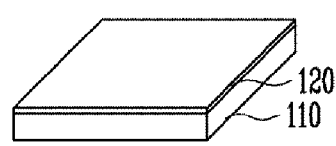
FIGS. 3A to 3N are diagrams illustrating a process of manufacturing the photo detector according to an exemplary embodiment of the present disclosure.
Figure 3B:
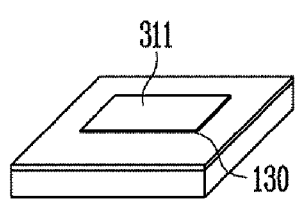
Figure 3C:
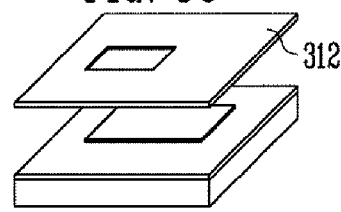
Figure 3D:
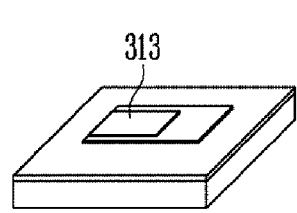
Figure 3E:
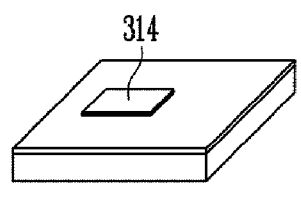
Figure 3F:
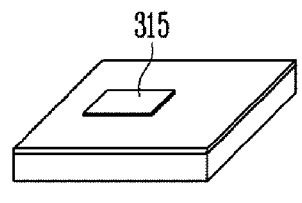
Figure 3G:
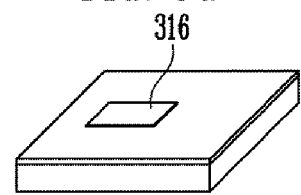
Figure 3H:
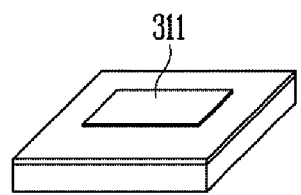
Figure 3I:
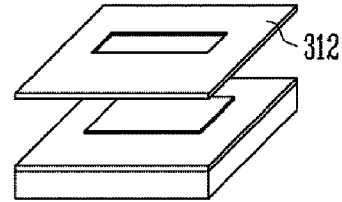
Figure 3J:
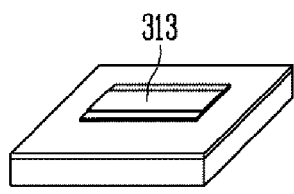
Figure 3K:
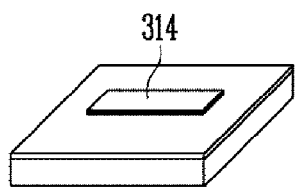
Figure 3L:
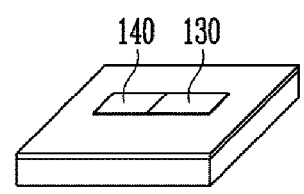
Figure 3M:
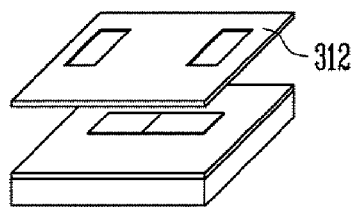
Figure 3N:
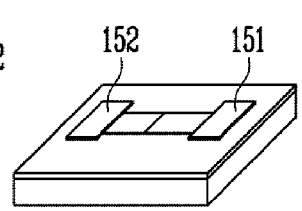

FIGS. 3A to 3N are diagrams illustrating a method of manufacturing the photo detector according to an exemplary embodiment of the present disclosure.

Referring to FIGS. 3A to 3N, in FIG. 3A, a substrate, in which the insulating layer 120 is formed on the conductive substrate 110, may be used. For example, a substrate, in which a silica dioxide ($SiO_2$) layer is formed on a doped silicon substrate, may be used. Accordingly, the conductive substrate 110 may be a doped silicon substrate, and the insulating layer 120 may be a silica dioxide layer.

In FIG. 3B, the single graphene 130 and a PMMA film 311, which are combined by, for example, a Chemical Vapor Deposition (CVD) process, are simultaneously formed on the prepared substrate. In this case, a graphene-polymethyl methacrylate (PMMA) sample, in which the PMMA is coated on the single graphene combined through the CVD process, may be transferred to the substrate as it is.

In FIG. 3C, a shadow mask 312 for forming a metal mask is aligned on the graphene-PMMA formed on the substrate. Then, an appropriate metal (copper (Cu) and gold (Au)) is deposited.

In FIG. 3D, a metal mask 313 is formed by the shadow mask 312.

In FIG. 3E, an unnecessary PMMA layer 314 is removed by an $O_2$ ash process by using the metal mask 313.

In FIG. 3F, the metal mask 313 is removed. The metal mask is the portion 313 positioned at the topmost end in FIG. 3E, and when the metal mask 313 is removed, the PMMA 315 is positioned at the topmost end.

In FIG. 3G, when the PMMA 315 formed on the single-layer graphene is removed, a finally patterned single-layer graphene 316 is obtained.

In FIG. 3H, the graphene-PMMA 317 sample the patterned single-layer graphene 316 used in FIG. 3B is transferred to the substrate.

In FIG. 3I, a shadow mask 318 for forming a metal mask is aligned on the graphene-PMMA 317 formed on the substrate. In this case, the shadow mask 318 is formed in a pattern having a larger distance than that in FIG. 3C so that the single-layer graphene 130 and the multi-layer graphene 140 are simultaneously formed. Then, an appropriate metal (copper (Cu) and gold (Au)) is deposited.

In FIG. 3J, a metal mask 319 is formed by the shadow mask 318.

In FIG. 3K, an unnecessary PMMA layer is removed by an $O_2$ ash process by using the metal mask 319.

In FIG. 3L, the metal mask 319 is removed. When the metal mask 319 is removed, the single-layer graphene 130 and the multi-layer graphene 140 may obtain the patterned graphenes.

In FIG. 3M, a shadow mask 321 for forming the metal electrode for measuring a current of the graphene photo detector is aligned.

In FIG. 3N, a final graphene photo detector, in which the appropriate metal electrodes are formed, may be manufactured.

The aforementioned process of manufacturing the graphene photo detector uses the graphene-PMMA sample, thereby minimizing a negative influence of a photoresist (artificial doping of the graphene) used in a semiconductor process.

Herein, the processes of FIGS. 3A to 3N may be sequentially performed.

FIG. 4 is a diagram illustrating a method of manufacturing the photo detector according to an exemplary embodiment of the present disclosure.

Referring to FIG. 4, a single-layer graphene and a PMMA film, which are combined, are formed on a prepared substrate (operation 411), and the method proceeds to operation 413. Here, the prepared substrate is a substrate, on which an insulating layer is formed, and a substrate, in which a silica dioxide layer is formed on a doped silicon substrate, may be used.

A first shadow mask is aligned on the formed graphene PMMA (operation 413), and the method proceeds to operation 415.

A first metal mask is formed by depositing a metal by using the aligned first shadow mask (operation 415), and the method proceeds to operation 417.

An unnecessary graphene-PMMA layer is removed through an ash process using the first metal mask (operation 417).

The first metal mask is removed (operation 419), and the method proceeds to operation 421.

The PMMA formed in the single-layer graphene is removed (operation 421, and the method proceeds to operation 423. In this case, the patterned single-layer graphene is formed.

The graphene-PMMA sample on the patterned single-layer graphene is transferred to the substrate (operation 423), and the method proceeds to operation 425.

A second shadow mask is aligned on the formed graphene-PMMA (operation 425), and the method proceeds to operation 427.

A second metal mask is formed by depositing a metal by using the aligned second shadow mask (operation 427), and the method proceeds to operation 429.

An unnecessary graphene-PMMA layer is removed by using the second metal mask (operation 429), and the method proceeds to operation 431.

The second metal mask and the PMMA are removed (operation 431), and the method proceeds to operation 433.

A third shadow mask is aligned (operation 433), and the method proceeds to operation 435. A metal electrode is formed by depositing an appropriate metal by using the third shadow mask, and the method proceeds to operation 435.

A photo detector, that is, a graphene photo detector, is generated by forming the metal electrode (operation 435), and the method is terminated.

The photo detector suggested in the present disclosure may avoid the forming of heterogeneous metal electrodes and minimize damage to the graphene during the manufacturing process. Further, the photo detector suggested in the present disclosure uses electrodes formed of a single metal by using a photothermoelectric effect generated on the boundary surface of the single-layer graphene and the multi-layer graphene, thereby simplifying a structure of an element and not being dependent on a wavelength of incident light. The photo detector suggested in the present disclosure may be utilized as an image sensor operable in wavelength bands of ultraviolet rays (UV), infrared rays (IR), and visible ray.

In the detailed description of the present disclosure, the particular exemplary embodiment has been described, but various modifications are available without departing from the scope of the present disclosure. Therefore, the scope of the present disclosure is not limited to the exemplary embodiments described, but shall be defined by the claims to be described below and the equivalents to the claims.

What is claimed is:

1. A photo detector, comprising:
   a conductive substrate;
   an insulating layer formed on the conductive substrate;
   a graphene structure formed on the insulating layer, the graphene structure including
     a single-layer graphene consisting of a single layer of graphene,
     a multi-layer graphene consisting of multiple layers of graphene, the multi-layer graphene being formed in an area different in plan view from an area in which the single-layer is formed, and
     a boundary surface in which the single-layer graphene contacts the multi-layer graphene;
   a first electrode formed at one end of the graphene structure; and
   a second electrode formed at an other end of the graphene structure.

2. The photo detector of claim 1, wherein the graphene structure has an interdigitated structure in which the single-layer graphene and the multi-layer graphene interdigitate each other.

3. The photo detector of claim 2, wherein each of the single-layer graphene and the multi-layer graphene is implemented in a form of quadrangular saw teeth.

4. The photo detector of claim 3, wherein the single-layer graphene and the multi-layer graphene have a structure, in which the saw teeth portions formed based on a direction connecting the first electrode and the second electrode are sequentially and alternately and disposed.

5. The photo detector of claim 2, wherein a photo current is increased by applying a voltage between the substrate and the first and second electrodes.

6. The photo detector of claim 1, wherein in response to a radiation of a light to the boundary surface of the graphene structure, a photo current flows between the first electrode and the second electrode.

* * * * *